United States Patent
Moon et al.

(10) Patent No.: US 8,987,006 B2
(45) Date of Patent: Mar. 24, 2015

(54) METHOD AND SYSTEM FOR PROVIDING A MAGNETIC JUNCTION HAVING AN ENGINEERED BARRIER LAYER

(75) Inventors: Kiseok Moon, Pleasanton, CA (US); Xueti Tang, San Jose, CA (US); Mohamad Towfik Krounbi, San Jose, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 196 days.

(21) Appl. No.: 13/451,679

(22) Filed: Apr. 20, 2012

(65) Prior Publication Data

US 2012/0267736 A1    Oct. 25, 2012

Related U.S. Application Data

(60) Provisional application No. 61/478,463, filed on Apr. 22, 2011.

(51) Int. Cl.
*H01L 21/00* (2006.01)
*H01L 43/08* (2006.01)
*H01L 27/22* (2006.01)
*H01L 43/12* (2006.01)

(52) U.S. Cl.
CPC ............. *H01L 43/08* (2013.01); *H01L 27/222* (2013.01); *H01L 27/224* (2013.01); *H01L 43/12* (2013.01)
USPC ......... 438/3; 257/295; 257/421; 257/E21.665

(58) Field of Classification Search
CPC ............................. H01L 27/222; H01L 27/224
USPC ........ 257/295, 421, E21.665; 438/3
See application file for complete search history.

(56) References Cited

U.S. PATENT DOCUMENTS

| 7,488,609 B1 * | 2/2009 | Lin et al. ............................. 438/3 |
| 8,202,572 B2 * | 6/2012 | Zhao et al. ..................... 427/130 |
| 2007/0111332 A1 | 5/2007 | Zhao et al. |
| 2008/0061388 A1 * | 3/2008 | Diao et al. ..................... 257/421 |

OTHER PUBLICATIONS

Tsunekawa et al., "Giant tunneling magnetoresistance effect in low-resistance CoFeB MgO (001) CoFeB magnetic tunnel junctions for read-head applications", Applied Physics Letters, 87, 072503 (2005).*

* cited by examiner

*Primary Examiner* — Robert Huber
(74) *Attorney, Agent, or Firm* — Convergent Law Group LLP

(57) ABSTRACT

A magnetic junction usable in a magnetic memory and a method for providing the magnetic memory are described. The method includes providing a pinned layer, providing an engineered nonmagnetic tunneling barrier layer, and providing a free layer. The pinned layer and the free layer each include at least one ferromagnetic layer. The engineered nonmagnetic tunneling barrier layer has a tuned resistance area product. In some aspects, the step of providing the engineered nonmagnetic tunneling barrier layer further includes radio-frequency depositing a first oxide layer, depositing a metal layer, and oxidizing the metal layer to provide a second oxide.

20 Claims, 7 Drawing Sheets

METHOD AND SYSTEM FOR PROVIDING A MAGNETIC JUNCTION HAVING AN ENGINEERED BARRIER LAYER

CROSS-REFERENCE TO RELATED APPLICATIONS

This application claims the benefit of provisional Patent Application Ser. No. 61/478,463, filed Apr. 22, 2011 and is incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional dual magnetic tunneling junction (MTJ) 10 as it may be used in a conventional STT-RAM. The conventional dual MTJ 10 typically resides on a bottom contact 11, uses conventional seed layer(s) 12 and includes a conventional antiferromagnetic (AFM) layer 14, a conventional pinned layer 16, a conventional tunneling barrier layer 18, a conventional free layer 20, and a conventional capping layer 22. Also shown is top contact 30.

Conventional contacts 11 and 30 are used in driving the current in a current-perpendicular-to-plane (CPP) direction, or along the z-axis as shown in FIG. 1. The conventional seed layer(s) 12 are typically utilized to aid in the growth of subsequent layers, such as the AFM layer 14, having a desired crystal structure. The conventional tunneling barrier layer 18 is nonmagnetic and is, for example, a thin insulator such as MgO.

The conventional pinned layer 16 and the conventional free layer 20 are magnetic. The magnetization 17 of the conventional pinned layer 16 is fixed, or pinned, in a particular direction, typically by an exchange-bias interaction with the AFM layer 14. Although depicted as a simple (single) layer, the conventional pinned layer 16 may include multiple layers. For example, the conventional pinned layer 16 may be a synthetic antiferromagnetic (SAF) layer including magnetic layers antiferromagnetically coupled through thin conductive layers, such as Ru. In such a SAF, multiple magnetic layers interleaved with a thin layer of Ru may be used.

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as in-plane, the magnetization 21 of the conventional free layer 20 may have a perpendicular anisotropy.

To switch the magnetization 21 of the conventional free layer 20, a current is driven perpendicular to plane (in the z-direction). When a sufficient current is driven between the top contact 30 and the bottom contact 11, the magnetization 21 of the conventional free layer 20 may switch to be parallel or antiparallel to the magnetization 17 of the conventional pinned layer 16. When a sufficient current is driven from the bottom contact 11 to the top contact 30, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10.

Although the conventional dual MTJ 10 may be written using spin transfer and used in an STT-RAM, there are drawbacks. For a high tunneling magnetoresistance (TMR), a low total resistance area (RA) value for the conventional MTJ 10 is desired. For example, an RA of less than $5\Omega\text{-}\mu m^2$ may be desired. This RA may be difficult to achieve with manufacturing the conventional tunneling barrier 18. Further, the conventional tunneling barrier 18 may be desired to have the desired crystal structure, the desired crystallographic orientation and be continuous. These features may be difficult to achieve in the conventional tunneling barrier layer 18. As a result, the conventional dual MTJ 10 may not have the desired performance.

Accordingly, what is desired is a method and system that may improve the performance of STT based memories, particularly by improving the performance of individual MTJs within the memory.

BRIEF SUMMARY OF THE INVENTION

A magnetic junction usable in a magnetic memory and a method for providing the magnetic memory are described. The method includes providing a pinned layer, providing an engineered nonmagnetic tunneling barrier layer, and providing a free layer. The pinned layer and the free layer each include at least one ferromagnetic layer. The engineered nonmagnetic tunneling barrier layer has a tuned resistance area product. In some aspects, the step of providing the engineered nonmagnetic tunneling barrier layer further includes radio-frequency depositing a first oxide layer, depositing a metal layer, and oxidizing the metal layer to provide a second oxide.

DETAILED DESCRIPTION OF THE INVENTION

Figure 1:
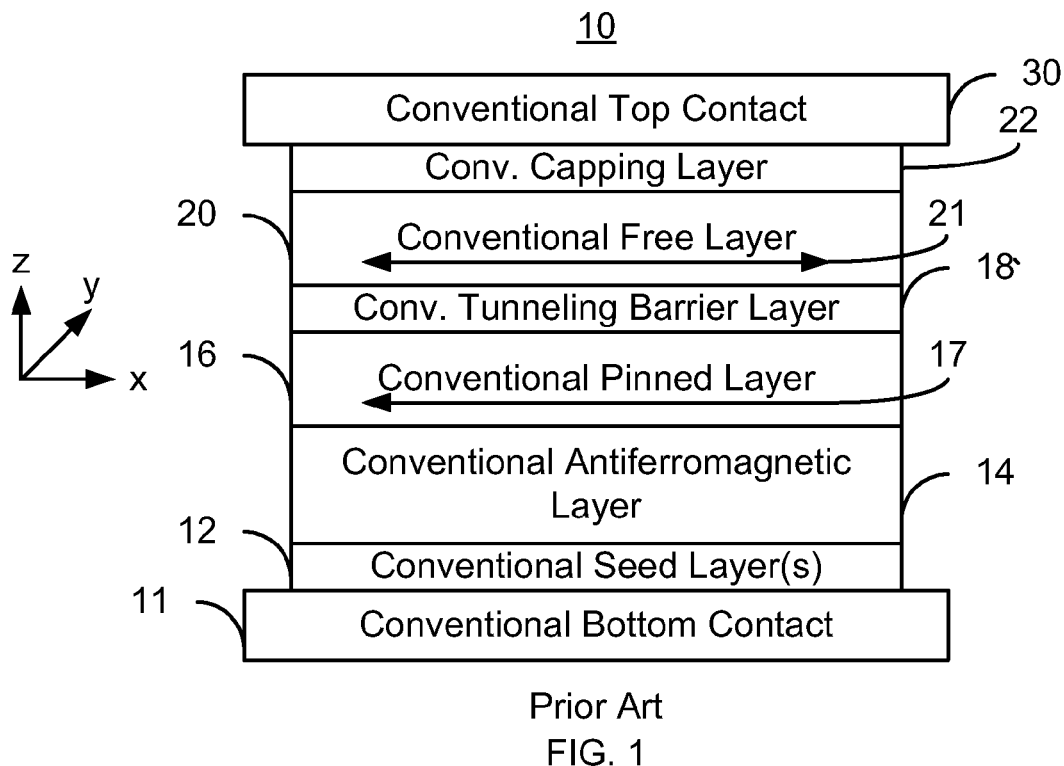
FIG. 1 depicts a conventional magnetic junction usable in a spin transfer torque memory.

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments are described in the context of particular magnetic junctions. One of ordinary skill in the art will readily recognize that the present invention is consistent with the use of magnetic junctions having other and/or additional components and/or other features not inconsistent with the present invention. The method and system are also described in the context of current understanding of the spin transfer phenomenon, magnetoresistance, of magnetic anisotropy, and other physical phenomenon. Consequently, one of ordinary skill in the art will readily recognize that theoretical explanations of the behavior of the method and system are made based upon this current understanding of spin transfer, magnetoresistance, magnetic anisotropy and other physical phenomenon. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or tunneling barriers having particular layers. However, one of ordinary skill in the art will readily recognize that magnetic junctions and/or tunneling barriers having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and barrier layers. However, one of ordinary skill in the art will readily recognize that the method and system are consistent with the use of magnetic memories having multiple magnetic junctions and using multiple barrier layers. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 2:
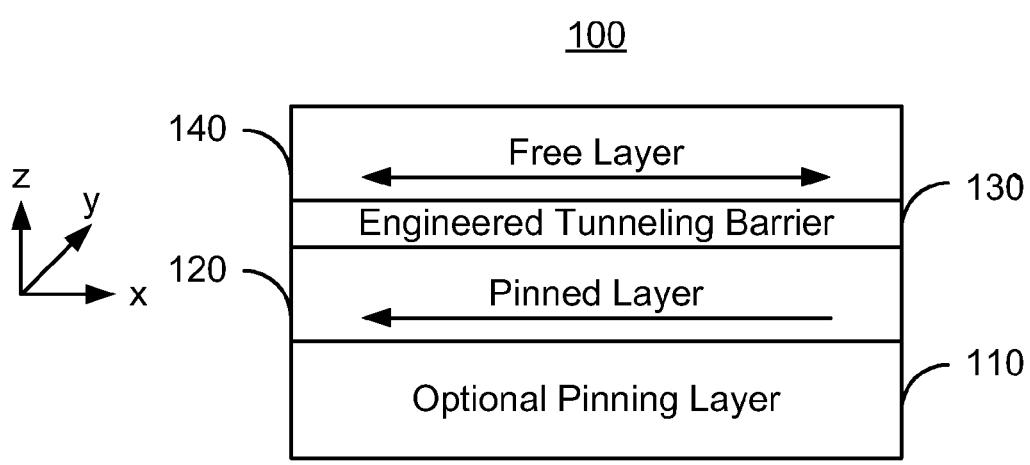
FIG. 2 depicts an exemplary embodiment of a barrier layer in a magnetic tunneling junction.

FIG. 2 depicts an exemplary embodiment of a magnetic junction 100 usable in a magnetic memory or in other applications. For example, the magnetic junction 100 may be used in a magnetic memory such as a spin tunneling torque random access memory (STT-RAM). For clarity, FIG. 2 is not to scale. The magnetic junction 100 may be a magnetic tunneling junction (MTJ), including an optional pinning layer 110, a pinned layer 120, a tunneling barrier 130, and a free layer 140. Although layers 110 and 140 are shown with a particular orientation, this orientation may vary in other embodiments. For example, in the embodiment shown, the pinned layer 120 is near the bottom and closer to a substrate (not shown) than the free layer 140. However, the pinned layer 120 may be near the top (further from a substrate that is not shown than the free layer 140) of the magnetic junction 100.

The pinning layer 110 may be an antiferromagnetic layer used to fix, or pin, the magnetization of the pinned layer 120 substantially in place. The pinning layer 110 may be omitted or may include multiple layers. The pinned and free layers 120 and 140 may include one or more of Ni, Fe, and Co, particularly in an alloy form. In some embodiments, the pinned layer 120 and free layer 140 include CoFe. In some such embodiments, the pinned layer 120 and free layer 140 consist of CoFeB. Although shown as simple layers, the pinned layer 120 and/or the free layer 140 may be a multilayer, such as a synthetic antiferromagnet including ferromagnetic layers interleaved with nonmagnetic layers. In some embodiments, the pinned layer 120 and/or the free layer 140 may have a high perpendicular anisotropy. Stated differently, the pinned layer 120 and/or free layer 140 may be weakly in-plane or may be perpendicular. For example, in some such embodiments, the perpendicular anisotropy energy of the pinned layer 120 and/or free layer 140 may be close to, but less than, the out-of-plane demagnetization energy (approaching $4\pi M_s$ for large cells and less than $4\pi M_s$ for smaller cells due to decreased demagnetization field at the edges).

The tunneling barrier layer 130 is an engineered tunneling barrier layer. As a result, the tunneling barrier layer 130 has a tunable resistance area product (RA). Stated differently, the RA of the barrier layer may be tuned within a desired range. For example, in some embodiments, the tunneling barrier layer 130 is a crystalline MgO layer. Although such a tunneling barrier layer 130 may appear to be structurally monolithic, the tunneling barrier 130 may be made of various sublayers. For example, in some embodiments, the tunneling barrier layer 130 may be considered to be formed of Mg insertion layers that sandwich a natural oxide MgO layer and a radio-frequency deposited (RF) MgO layer. In other embodiments, one or more of the Mg insertion layers may be omitted. Although deposited as Mg layers, it is believed that the Mg insertion layers become oxidized during processing of the magnetic junction 100. For example, during annealing, oxygen from other layers in the magnetic junction 100 may migrate to the Mg insertion layers. Thus, the Mg insertion layers become oxidized and the tunneling barrier 130 appears to be formed of a single Mg layer.

Use of the tunneling barrier layer 130 may provide benefits to the magnetic junction 100. By tailoring the sublayers (not explicitly shown in FIG. 2), the RA of the tunneling barrier layer 130, and thus the magnetic junction 100, may be more finely tuned over a wide range of RAs. In some embodiments, the achievable RAs may vary almost continuously for the tunneling barrier layer 130. Further, the RAs achieved may be more reproducible and reliable. In addition, the magnetic junction 100 may have a higher tunneling magnetoresistance ratio than for either a barrier layer formed only by RF deposition or only be naturally oxidizing an Mg metal layer. In some embodiments, the spin torque efficiency may also be improved. Stated differently, a lower write current may be used to change the magnetization direction of the free layer 140 via spin transfer torque. Further, use of the tunneling barrier layer may allow the perpendicular anisotropy level for the free layer 140 adjacent to the tunneling barrier layer 130 to be engineered. The tunneling barrier layer 130 may be used to increase the perpendicular anisotropy of the free layer 140. For example, use of the Mg insertion layer(s), described above and below, may enhance the perpendicular anisotropy of the free layer 140. An increase in the perpendicular anisotropy may improve the switching characteristics of the free layer 140, particular for spin transfer torque induced switching.

Figure 3:
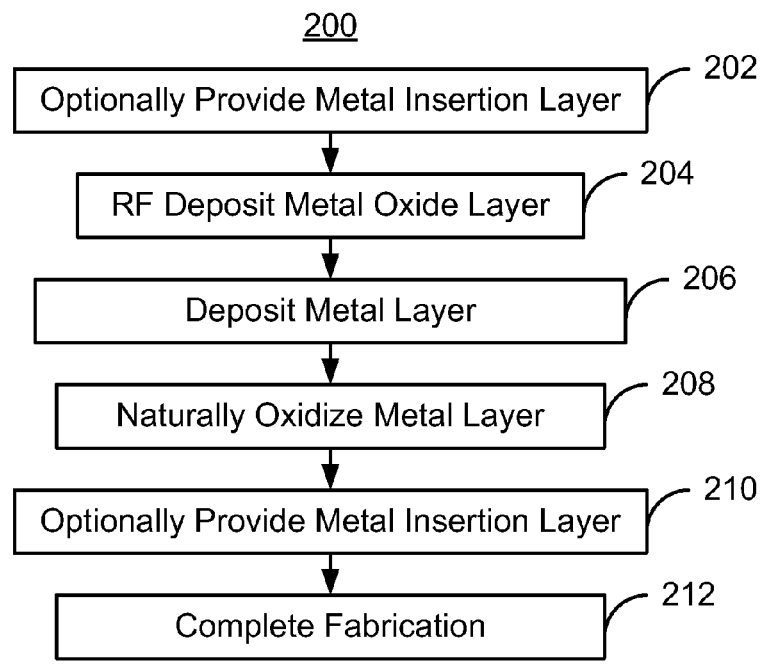
FIG. 3 is a flow chart depicting an exemplary embodiment of a method for forming a barrier layer in a magnetic tunneling junction.

FIG. 3 depicts an exemplary embodiment of a method 200 for fabricating a tunneling barrier, such as the tunneling barrier layer 130. For simplicity, some steps may be omitted, combined, or interleaved. The method 200 is described in the context of the magnetic junction 100 and tunneling barrier layer 130. However, the method 200 may be used on other magnetic junctions and other tunneling barrier layers. Further, the method 200 may be incorporated into fabrication of magnetic memories and/or magnetic junctions. For example, the method 200 may be used in manufacturing a STT-RAM or other magnetic memory. The method is also described in the context of MgO. However, in other embodiments other metals and/or oxides may be used.

A first metal insertion layer is optionally deposited on the underlying layer, via step 202. In some embodiments, the metal insertion layer is an Mg layer. This layer is desired to be thin. For example, in some embodiments, the first Mg insertion layer may be at least one and not more than four Angstroms thick. Thus, the Mg insertion layer may be not more than two monolayers thick. In some embodiments, step 202 may be omitted.

A metal oxide layer is deposited using RF-Sputtering techniques, via step 204. For example, the metal oxide layer may be RF sputtered in step 204. In some embodiments, the metal for the oxide may be the same as the metal insertion layer. For example, step 204 may include RF depositing an MgO (RF MgO) layer when an Mg insertion layer is deposited in step 202. However, in alternate embodiments, different metals may be used in the layers formed in steps 202 and 204. The RF MgO layer thickness may be varied depending upon the desired characteristics of the tunneling barrier layer 130. In some embodiments, the RF MgO layer is at least two and not more than three monolayers thick.

A metal layer is deposited, via step 206 and naturally oxidized in step 208. Thus, a natural oxide layer is formed in steps 206 and 208. The natural oxide formed in steps 206-208 may be the same as the RF oxide formed in step 204 or may be different. In some embodiments, an Mg layer is deposited in step 206 and naturally oxidized in step 208. In some embodiments, the tunneling barrier layer 130 includes an RF MgO layer and a natural oxide MgO layer. The Mg layer deposited in step 206 may be at least two monolayers thick. Thus, the natural oxide layer may be greater than or, in some embodiments, equal to two monolayers thick. Note that in some embodiments, step 204 may occur after step 208. Thus, in some embodiments, the RF MgO layer is closer to the substrate than the natural oxide MgO layer. In other embodiments, the RF MgO layer is further from the substrate than the natural oxide MgO layer. In some embodiments, steps 204 and/or 206 may be repeated so that more than one RF MgO layer and/or more than one naturally oxidized MgO layer may be used. However, in such embodiments, the RF MgO layer and the natural oxide MgO layers are desired to be interleaved.

A second metal insertion layer is optionally deposited, via step 210. In some embodiments, the metal insertion layer is an Mg layer. This layer is desired to be thin. For example, in some embodiments, the second Mg insertion layer may be at least one and not more than four Angstroms thick. Thus, the Mg insertion layer may be not more than two monolayers thick. In some embodiments, the second metal insertion layer is the same metal as the first metal insertion layer. In other embodiments, the insertion layers may be different. Further, although described as "metals", the insertion layers and oxides formed in steps 202-210 may be alloys containing multiple metals. The tunneling barrier 130 may thus include an RF oxide and a natural oxide sandwiched between two metal insertion layers.

Fabrication of the magnetic junction 100 may be completed, via step 212. In step 212, one or more annealing steps may be carried out. As a result, some or all of the metal insertion layer(s) provided in steps 202 and/or 210 may be oxidized. Thus, the tunneling barrier layer 130, in which metal insertion layers may be partially or completed oxidized, may be fabricated. Using the method 200, the magnetic junction 100 may be formed. Thus, one or more of the benefits of the magnetic junction 100 may be achieved.

Figure 4:
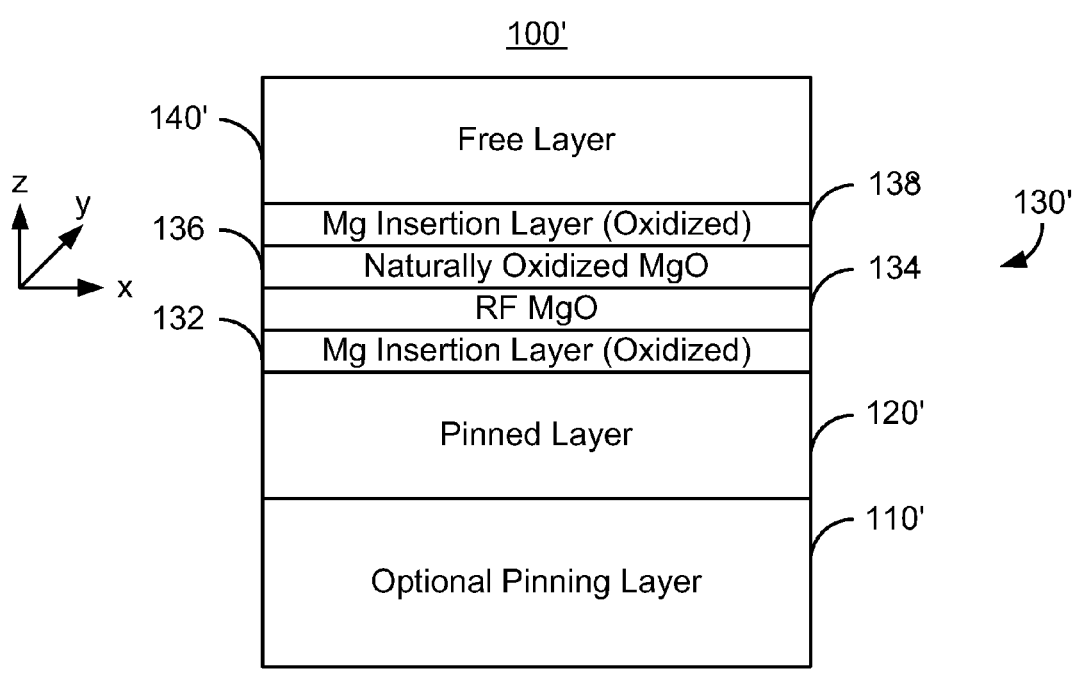
FIG. 4 is another exemplary embodiment of a barrier layer in a magnetic tunneling junction.

FIG. 4 depicts an exemplary embodiment of a magnetic junction 100' usable in a magnetic memory or in other applications. For example, the magnetic junction 100' may be used in a magnetic memory such as an STT-RAM. For clarity, FIG. 4 is not to scale. The magnetic junction 100' is analogous to the magnetic junction 100. Consequently, analogous components are labeled similarly. The magnetic junction 100' thus includes an optional pinning layer 110', a pinned layer 120', a tunneling barrier layer 130', and a free layer 140' that are analogous to the optional pinning layer 110, the pinned layer 120, the tunneling barrier layer 130, and the free layer 140. Although layers 110', 120', 130', and 140' are shown with a particular orientation, this orientation may vary in other embodiments. For example, the pinned layer 120' may be near the top (furthest from a substrate that is not shown) of the magnetic junction 100'. In addition, although depicted as simple layers, the pinned layer 120' and/or the free layer 140' may include multiple layers. In addition, the pinning layer 110' may be omitted or may include multiple layers.

The tunneling barrier 130' is shown as including multiple layers. In particular, a first metal insertion layer 132, an RF oxide layer 134, a natural oxide layer 136, and a second metal insertion layer 138 are shown. Other layers may also be included. Further, the arrangement of the layers 132, 134, 136, and 138 may differ. In addition, some of the layers 132 and 128 may be omitted. For simplicity, the insertion and oxide layers are described in the context of Mg layers. However, in alternate embodiments, other metals might be used.

However, there may be additional benefits to the use of Mg. The Mg insertion layer 132 is provided in step 202 of the method 200. The RF MgO layer 134 is provided in step 204 of the method 200. The naturally oxidized MgO layer 136 is provided in steps 206 and 208 of the method 200. The second Mg insertion layer 138 is provided in step 210 of the method 200. Further, the Mg insertion layers 132 and 138 may be oxidized in step 212 of the method 200, as is indicated in FIG. 4. Although shown with a particular arrangement with respect to the substrate (bottom as shown in FIG. 4), the arrangement of the layers 132, 134, 136, and 138 may differ.

The first Mg insertion layer 132 may be thin. For example, the Mg insertion layer 132 may be at least one and not more than four Angstroms thick. Thus, the Mg insertion 132 layer may be not more than two monolayers thick. The RF MgO layer 136 may be two to three monolayers thick. The metal layer from which the naturally oxidized MgO layer 136 is formed may be two or more monolayers thick. The second Mg insertion layer 138 may also be thin, for example not more than four Angstroms thick. Thus, the Mg insertion layer 138 may be not more than two monolayers thick.

The magnetic junction 100' may share the benefits of the magnetic junction 100. For example, use of the RF MgO layer 134 in combination with the naturally oxidized MgO layer 136 may allow the RA of the tunneling barrier 130', and thus the magnetic junction 100' to be tuned. For example, by varying the thickness of each layer 134 and 136, including their relative thicknesses and total thickness of both layers 134 and 136 together, a variety of RAs may be achieved. Thus, the RA of the magnetic junction 100' may be tuned. Use of the insertion layers 132 and 138, which are also oxidized during fabrication of the junction 100' may also allow for tailoring of the RA of the tunneling barrier 130' and thus the magnetic junction 100'. Further, the RAs achieved may be more reproducible and reliable. In addition, the magnetic junction 100' may have a higher tunneling magnetoresistance ratio than for either a barrier layer formed only by RF deposition or only be naturally oxidizing an Mg metal layer. In some embodiments, the spin torque efficiency may also be improved. Further, the perpendicular anisotropy level for the free layer 140' adjacent to the tunneling barrier layer 130' may be enhanced. An increase in the perpendicular anisotropy may improve the switching characteristics of the free layer 140', particular for spin transfer torque induced switching. Thus, the performance and manufacturability of the magnetic junction 100' may be improved.

Figure 5:
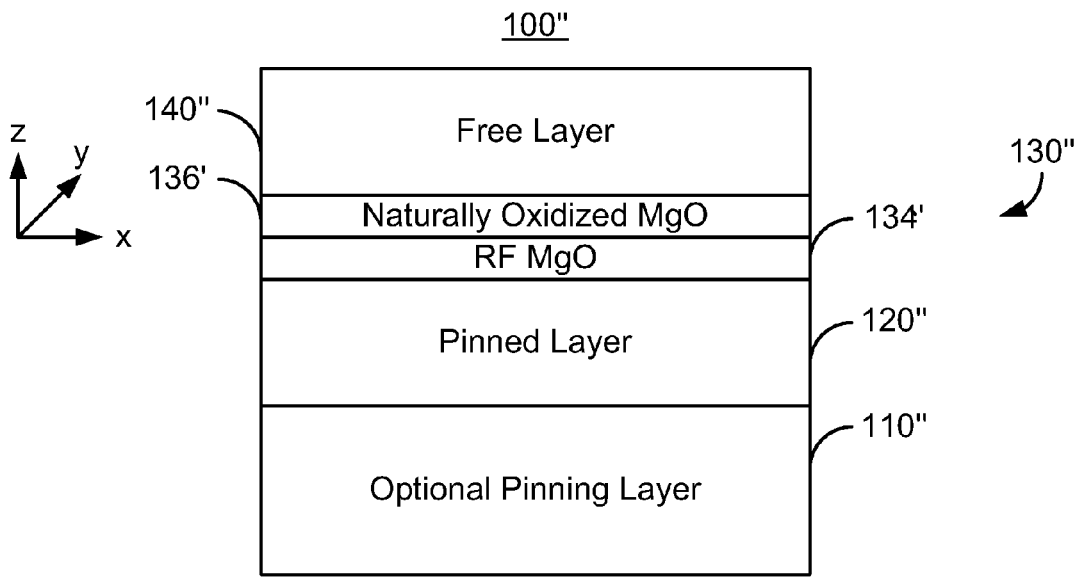
FIG. 5 is another exemplary embodiment of a barrier layer in a magnetic tunneling junction.

FIG. 5 depicts an exemplary embodiment of a magnetic junction 100" usable in a magnetic memory or in other applications. For example, the magnetic junction 100" may be used in a magnetic memory such as an STT-RAM. For clarity, FIG. 5 is not to scale. The magnetic junction 100" is analogous to the magnetic junctions 100 and 100'. Consequently, analogous components are labeled similarly. The magnetic junction 100" thus includes an optional pinning layer 110", a pinned layer 120", a tunneling barrier layer 130", and a free layer 140" that are analogous to the optional pinning layer 110/110', the pinned layer 120/120', the tunneling barrier layer 130/130', and the free layer 140/140'. Although layers 110", 120", 130", and 140" are shown with a particular orientation, this orientation may vary in other embodiments. For example, the pinned layer 120" may be near the top (furthest from a substrate that is not shown) of the magnetic junction 100". In addition, although depicted as simple layers, the pinned layer 120" and/or the free layer 140" may include multiple layers. In addition, the pinning layer 110" may be omitted or may include multiple layers. Further, the arrangement of the layers 134' and 136' may differ.

The tunneling barrier 130" includes multiple layers. An RF oxide layer 134' and a natural oxide layer 136' are shown. Other layers may also be included. Further, the arrangement of the layers 134' and 136' may differ. For simplicity, the oxide layers are described in the context of Mg layers. However, in alternate embodiments, other metals might be used. However, there may be additional benefits to the use of Mg. The RF MgO layer 134' may be provided in step 204 of the method 200. The naturally oxidized MgO layer 136' may be provided in steps 206 and 208 of the method 200. Although shown as below the naturally oxidized MgO layer 136', the RF MgO layer 134' may be above the naturally oxidized MgO layer 136'. The RF MgO layer 134' and the naturally oxidized MgO layer 136' may have the same thicknesses as the layers 134 and 136, respectively. However, in other embodiments, the layers 134' and 136' may have different thicknesses.

The magnetic junction 100" may share at least some of the benefits of the magnetic junctions 100 and 100'. For example, use of the RF MgO layer 134 in combination with the naturally oxidized MgO layer 136' may allow the RA of the tunneling barrier 130", and thus the magnetic junction 100" to be tuned. For example, by varying the thickness of each layer 134' and 136', including their relative thicknesses and total thickness of both layers 134' and 136' together, a variety of RAs may be achieved. Thus, the RA of the magnetic junction 100" may be tuned. Further, the RAs achieved may be more reproducible and reliable. In addition, the magnetic junction 100" may have a higher tunneling magnetoresistance ratio than for either a barrier layer formed only by RF deposition or only be naturally oxidizing an Mg metal layer. In some embodiments, the spin torque efficiency may also be improved. Further, in some embodiments, the perpendicular anisotropy level for the free layer 140" adjacent to the tunneling barrier layer 130" may be enhanced. Thus, the performance and manufacturability of the magnetic junction 100" may be improved.

Figure 6:
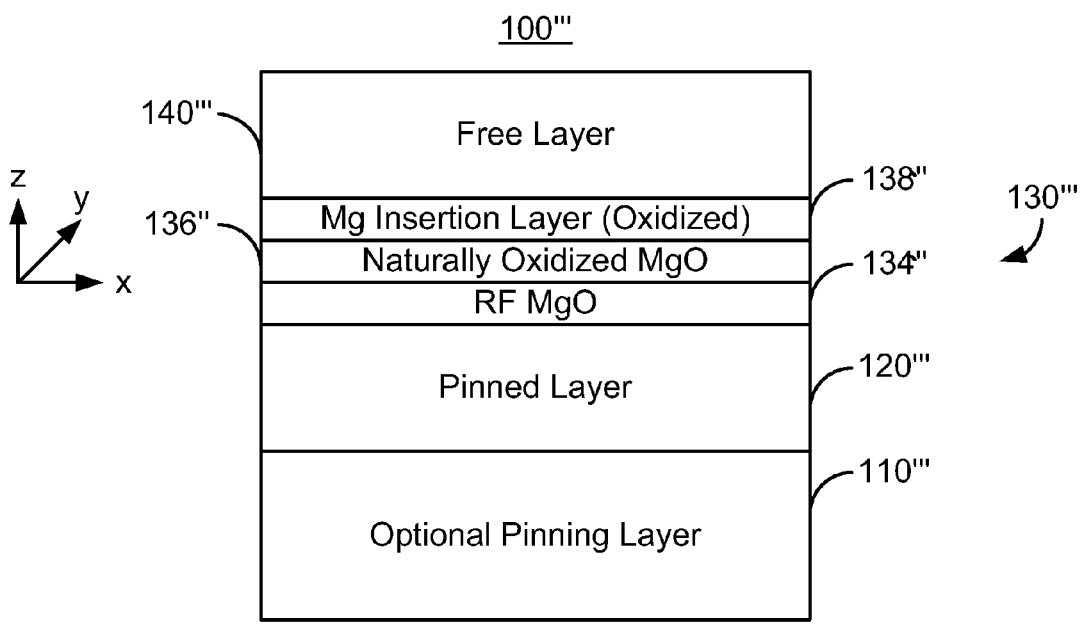
FIG. 6 is another exemplary embodiment of a barrier layer in a magnetic tunneling junction

FIG. 6 depicts an exemplary embodiment of a magnetic junction 100''' usable in a magnetic memory or in other applications. For example, the magnetic junction 100''' may be used in a magnetic memory such as an STT-RAM. For clarity, FIG. 6 is not to scale. The magnetic junction 100''' is analogous to the magnetic junctions 100, 100', and 100". Consequently, analogous components are labeled similarly. The magnetic junction 100''' thus includes an optional pinning layer 110''', a pinned layer 120''', a tunneling barrier layer 130''', and a free layer 140''' that are analogous to the optional pinning layer 110/110'/110", the pinned layer 120/120'/120", the tunneling barrier layer 130/130'/130", and the free layer 140/140'/140". Although layers 110''', 120''', 130''', and 140''' are shown with a particular orientation, this orientation may vary in other embodiments. For example, the pinned layer 120''' may be near the top (furthest from a substrate that is not shown) of the magnetic junction 100'''. In addition, although depicted as simple layers, the pinned layer 120''' and/or the free layer 140''' may include multiple layers. In addition, the pinning layer 110''' may be omitted or may include multiple layers.

The tunneling barrier 130''' includes multiple layers. An RF oxide layer 134", a natural oxide layer 136", and an insertion layer 138" are shown. Other layers may also be included. Further, the arrangement of the layers 134", 136", and 138" may differ. For simplicity, the insertion and oxide layers are described in the context of Mg layers. However, in alternate embodiments, other metals might be used. However, there may be additional benefits to the use of Mg. The RF MgO layer 134" may be provided in step 204 of the method 200. The naturally oxidized MgO layer 136" may be provided in steps 206 and 208 of the method 200. The Mg insertion layer 138" may be provided in step 210 of the method 200. Although shown as below the naturally oxidized MgO layer 136", the RF MgO layer 134" may be above the naturally oxidized MgO layer 136'". Further, the insertion layer 138" may be partially or fully oxidized in step 212. The RF MgO layer 134", the naturally oxidized MgO layer 136", and the Mg insertion layer 138" may have the same thicknesses as the layers 134, 136, and 138, respectively. However, in other embodiments, the layers 134", 136", and 138" may have different thicknesses.

The magnetic junction 100'" may share at least some of the benefits of the magnetic junctions 100, 100', and 100". For example, use of the RF MgO layer 134" in combination with the naturally oxidized MgO layer 136" may allow the RA of the tunneling barrier 130'", and thus the magnetic junction 100'" to be tuned as described above. Further, the RAs achieved may be more reproducible and reliable. In addition, the magnetic junction 100'" may have a higher tunneling magnetoresistance ratio than for either a barrier layer formed only by RF deposition or only be naturally oxidizing an Mg metal layer. In some embodiments, the spin torque efficiency may also be improved. Further, in some embodiments, the perpendicular anisotropy level for the free layer 140'" adjacent to the tunneling barrier layer 130'" may be enhanced. Thus, the performance and manufacturability of the magnetic junction 100'" may be improved.

Figure 7:
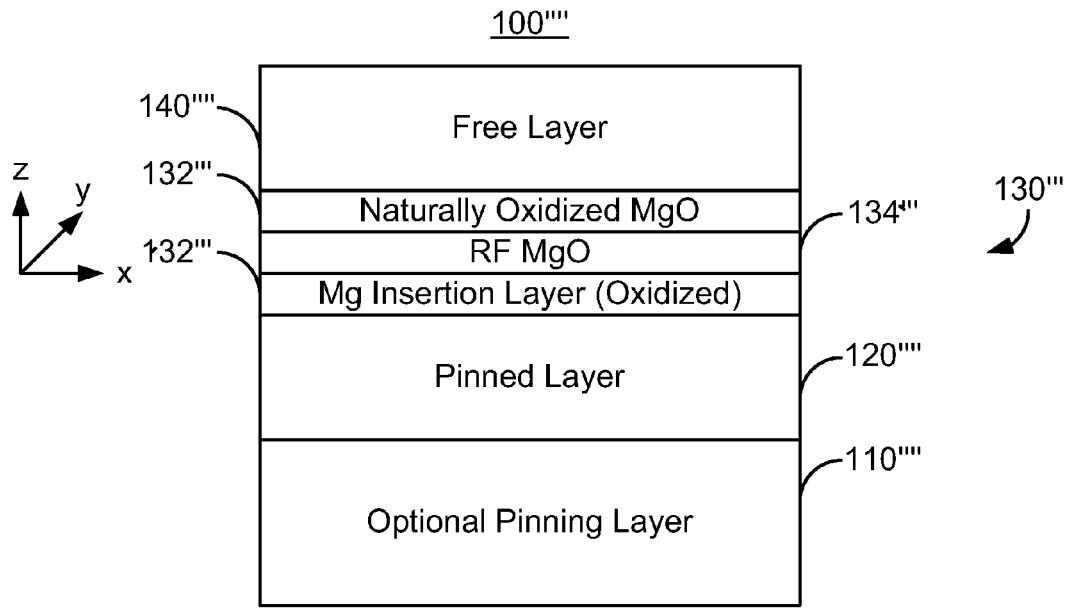
FIG. 7 depicts another exemplary embodiment of a barrier layer in a magnetic tunneling junction.

FIG. 7 depicts an exemplary embodiment of a magnetic junction 100"" usable in a magnetic memory or in other applications. For example, the magnetic junction 100"" may be used in a magnetic memory such as an STT-RAM. For clarity, FIG. 7 is not to scale. The magnetic junction 100"" is analogous to the magnetic junctions 100, 100', 100", and 100'". Consequently, analogous components are labeled similarly. The magnetic junction 100"" thus includes an optional pinning layer 110"", a pinned layer 120"", a tunneling barrier layer 130"", and a free layer 140"" that are analogous to the optional pinning layer 110/110'/110"/110'", the pinned layer 120/120'/120"/120'", the tunneling barrier layer 130/130'/130"/130'", and the free layer 140/140'/140"/140'". Although layers 110"", 120"", 130"", and 140"" are shown with a particular orientation, this orientation may vary in other embodiments. For example, the pinned layer 120"" may be near the top (furthest from a substrate that is not shown) of the magnetic junction 100"". In addition, although depicted as simple layers, the pinned layer 120"" and/or the free layer 140"" may include multiple layers. In addition, the pinning layer 110"" may be omitted or may include multiple layers.

The tunneling barrier 130"" includes multiple layers. An insertion layer 132'", an RF oxide layer 134'" and a natural oxide layer 136'" are shown. Other layers may also be included. Further, the arrangement of the layers 132'", 134'" and 136'" may differ. For simplicity, the insertion and oxide layers are described in the context of Mg layers. However, in alternate embodiments, other metals might be used. However, there may be additional benefits to the use of Mg. The Mg insertion layer 132'" may be provided in step 202 of the method 200. The RF MgO layer 134'" may be provided in step 204 of the method 200. The naturally oxidized MgO layer 136'" may be provided in steps 206 and 208 of the method 200. Further, the insertion layer 132'" may be partially or fully oxidized in step 212. Although shown as below the naturally oxidized MgO layer 136", the RF MgO layer 134'" may be above the naturally oxidized MgO layer 136'". The Mg insertion layer 132'", the RF MgO layer 134'" and the naturally oxidized MgO layer 136'" may have the same thicknesses as the layers 132, 134, and 136, respectively. However, in other embodiments, the layers 132'", 134'" and 136'" may have different thicknesses.

The magnetic junction 100"" may share at least some of the benefits of the magnetic junctions 100, 100', 100", and 100'". For example, use of the RF MgO layer 134'" in combination with the naturally oxidized MgO layer 136'" may allow the RA of the tunneling barrier 130"", and thus the magnetic junction 100"" to be tuned as described above. Further, the RAs achieved may be more reproducible and reliable. In addition, the magnetic junction 100"" may have a higher tunneling magnetoresistance ratio than for either a barrier layer formed only by RF deposition or only be naturally oxidizing an Mg metal layer. In some embodiments, the spin torque efficiency may also be improved. Further, in some embodiments, the perpendicular anisotropy level for the free layer 140"" adjacent to the tunneling barrier layer 130"" may be enhanced. Thus, the performance and manufacturability of the magnetic junction 100"" may be improved.

Figure 8:
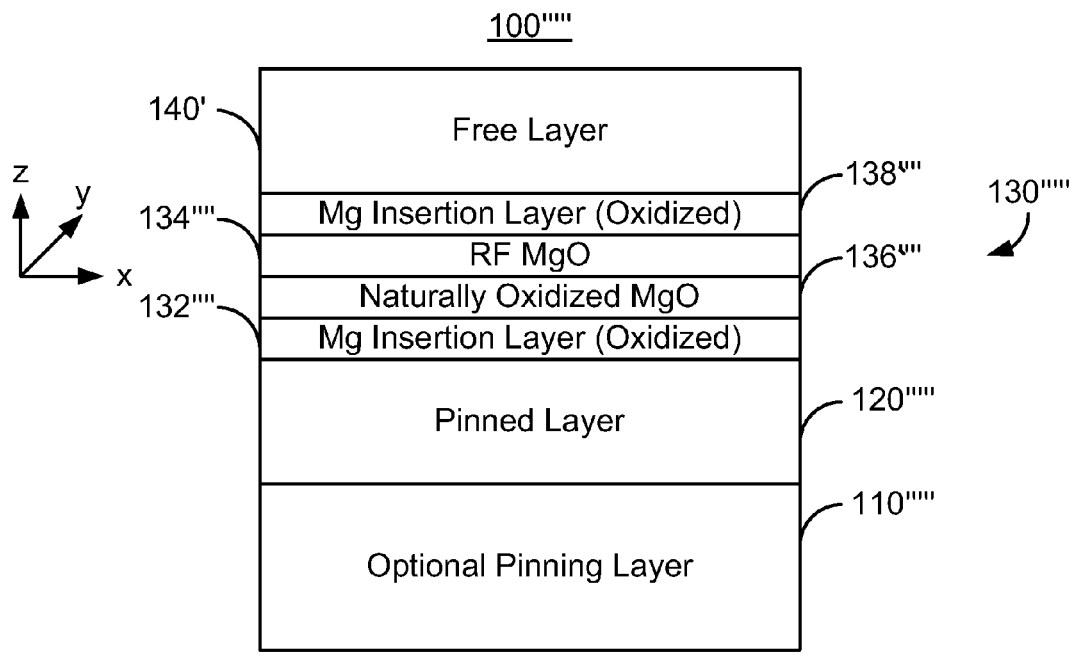
FIG. 8 is another exemplary embodiment of a barrier layer in a magnetic tunneling junction.

FIG. 8 depicts an exemplary embodiment of a magnetic junction 100""' usable in a magnetic memory or in other applications. For example, the magnetic junction 100""' may be used in a magnetic memory such as an STT-RAM. For clarity, FIG. 8 is not to scale. The magnetic junction 100""' is analogous to the magnetic junctions 100, 100', 100", 100'", and 100"". Consequently, analogous components are labeled similarly. The magnetic junction 100""' thus includes an optional pinning layer 110""', a pinned layer 120""', a tunneling barrier layer 130""', and a free layer 140""' that are analogous to the optional pinning layer 110/110'/110"/110'"/110"", the pinned layer 120/120'/120"/120'"/120"", the tunneling barrier layer 130/130'/130"/130'"/130"", and the free layer 140/140'/140"/140'"/140"". Although layers 110""', 120""', 130""', and 140""' are shown with a particular orientation, this orientation may vary in other embodiments. For example, the pinned layer 120""' may be near the top (furthest from a substrate that is not shown) of the magnetic junction 100""'. In addition, although depicted as simple layers, the pinned layer 120""' and/or the free layer 140""' may include multiple layers. In addition, the pinning layer 110""' may be omitted or may include multiple layers.

The tunneling barrier 130""' includes multiple layers. An insertion layer 132"", an RF oxide layer 134"" a natural oxide layer 136"", and an insertion layer 138"" are shown. Other layers may also be included. Further, the arrangement of the layers 132"", 134"" and 136"" may differ. For simplicity, the insertion and oxide layers are described in the context of Mg layers. However, in alternate embodiments, other metals might be used. However, there may be additional benefits to the use of Mg. The Mg insertion layer 132"" may be provided in step 202 of the method 200. The RF MgO layer 134"" may be provided in step 204 of the method 200. The naturally oxidized MgO layer 136"" may be provided in steps 206 and 208 of the method 200. The Mg insertion layer 138"" may be provided in step 210 of the method 200. Further, the insertion layers 132"" and 138"" may be partially or fully oxidized in step 212. In this embodiment, the naturally oxidized MgO layer 134"" is provided before and thus resides under the RF MgO layer 136"". The Mg insertion layer 132"", the RF MgO layer 134"", the naturally oxidized MgO layer 136"", and the Mg insertion layer 138"" may have the same thicknesses as the layers 132, 134, 136, and 138, respectively. However, in other embodiments, the layers 132"", 134"", 136"", and 138"" may have different thicknesses.

The magnetic junction 100""' may share at least some of the benefits of the magnetic junctions 100, 100', 100", 100'", and 100"". For example, use of the RF MgO layer 134"" in combination with the naturally oxidized MgO layer 136'''' may allow the RA of the tunneling barrier 130''''', and thus the magnetic junction 100''''' to be tuned as described above. Further, the RAs achieved may be more reproducible and reliable. In addition, the magnetic junction 100''''' may have a higher tunneling magnetoresistance ratio than for either a barrier layer formed only by RF deposition or only be naturally oxidizing an Mg metal layer. In some embodiments, the spin torque efficiency may also be improved. Further, in some embodiments, the perpendicular anisotropy level for the free layer 140'''' adjacent to the tunneling barrier layer 130''''' may be enhanced. Thus, the performance and manufacturability of the magnetic junction 100''''' may be improved.

Figure 9:
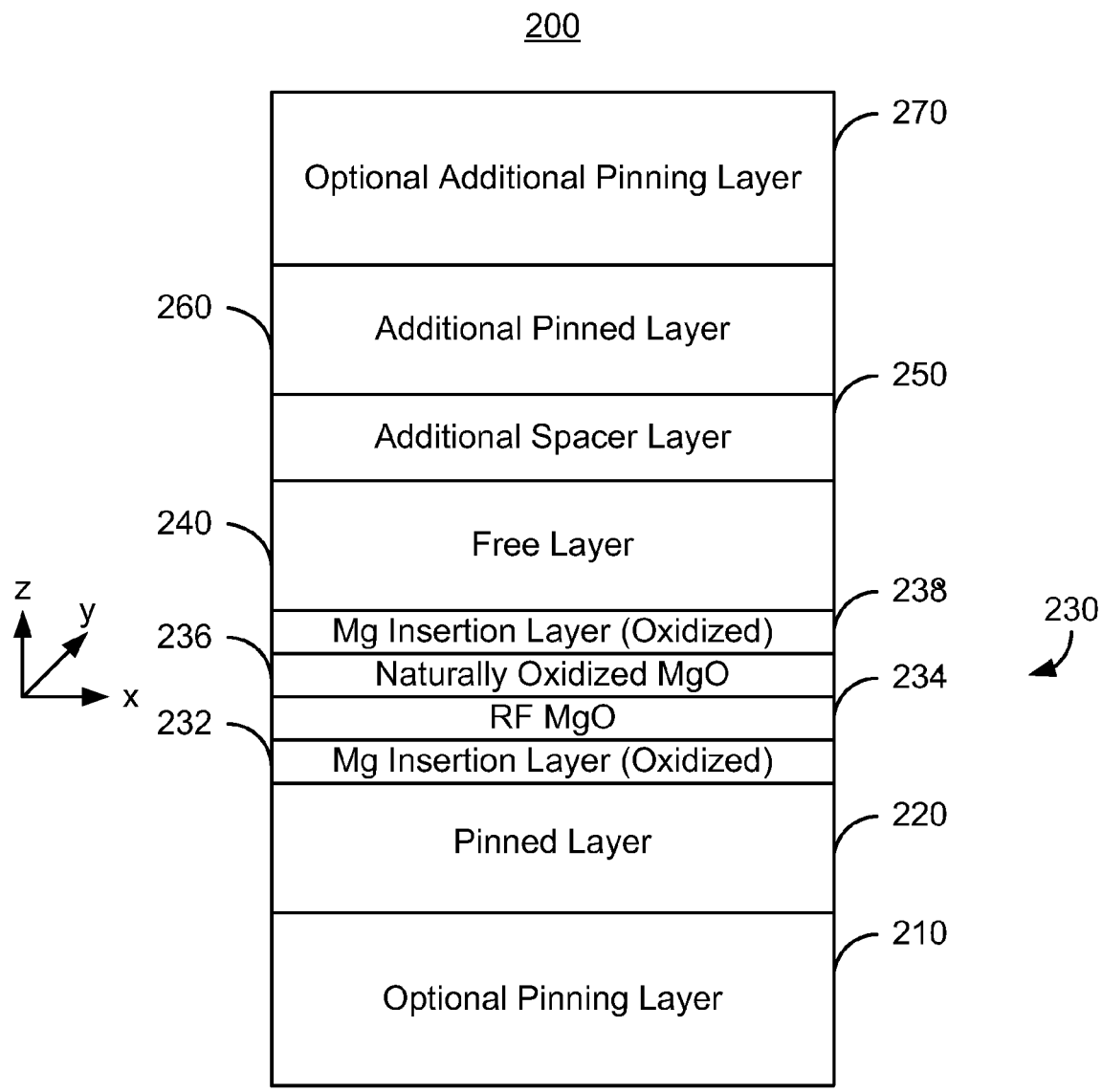
FIG. 9 is another exemplary embodiment of a barrier layer in a magnetic tunneling junction.

FIG. 9 depicts an exemplary embodiment of a magnetic junction 200 usable in a magnetic memory or in other applications. For example, the magnetic junction 200 may be used in a magnetic memory such as an STT-RAM. For clarity, FIG. 9 is not to scale. The magnetic junction 200 is analogous to the magnetic junctions 100, 100', 100'', 100''', 100'''', and 100'''''. Consequently, analogous components are labeled similarly. The magnetic junction 200 thus includes an optional pinning layer 210, a pinned layer 220, a tunneling barrier layer 230, and a free layer 240 that are analogous to the optional pinning layer 110/110'/110''/110'''/110''''/110''''', the pinned layer 120/120'/120''/120'''/120''''/120''''', the tunneling barrier layer 130/130'/130''/130'''/130''''/130''''', and the free layer 140/140'/140''/140'''/140''''/140'''''. Although layers 210, 220, 230, 240, 250, 260, and 270 are shown with a particular orientation, this orientation may vary in other embodiments. In addition, although depicted as simple layers, the pinned layer 220 and/or the free layer 240 may include multiple layers. In addition, the pinning layer 210 may be omitted or may include multiple layers.

The tunneling barrier 230 includes multiple layers. An insertion layer 232, an RF oxide layer 234, a natural oxide layer 236, and an insertion layer 238 are analogous to the layers 132, 134, 136, and 138, respectively. Further, some of the layers 232 and/or 238 might be omitted. Although deposited as metal layers, some or all of the layers 232 and 238 may be oxidized during processing of the magnetic junction 200.

The magnetic junction 200 also includes an additional spacer layer 250, an additional pinned layer 260, and an optional additional pinning layer 270. The pinned layer 260 and pinning layer 270 are analogous to the layers 220 and 210, respectively. Further, the spacer layer 250 may be conductive, an insulating tunneling barrier layer, or other layer. If the spacer layer 250 is a tunneling barrier layer, then the spacer layer 250 may be analogous to the layer 230. The pinned layer 260 may thus be a simple layer, as shown, or a multilayer. Similarly, the optional pinning layer 270 may be omitted or may be a multilayer.

The magnetic junction 200 may share at least some of the benefits of the magnetic junctions 100, 100', 100'', 100''', 100'''', and/or 100'''''. For example, use of the RF MgO layer 234 in combination with the naturally oxidized MgO layer 236 may allow the RA of the tunneling barrier 230, and thus the magnetic junction 200 to be tuned as described above. Further, the RAs achieved may be more reproducible and reliable. In addition, the magnetic junction 200 may have a higher tunneling magnetoresistance ratio than for either a barrier layer formed only by RF deposition or only be naturally oxidizing an Mg metal layer. In some embodiments, the spin torque efficiency may also be improved. Further, in some embodiments, the perpendicular anisotropy level for the free layer 240 adjacent to the tunneling barrier layers 230 and 250 may be enhanced. Thus, the performance and manufacturability of the magnetic junction 200 may be improved.

Figure 10:
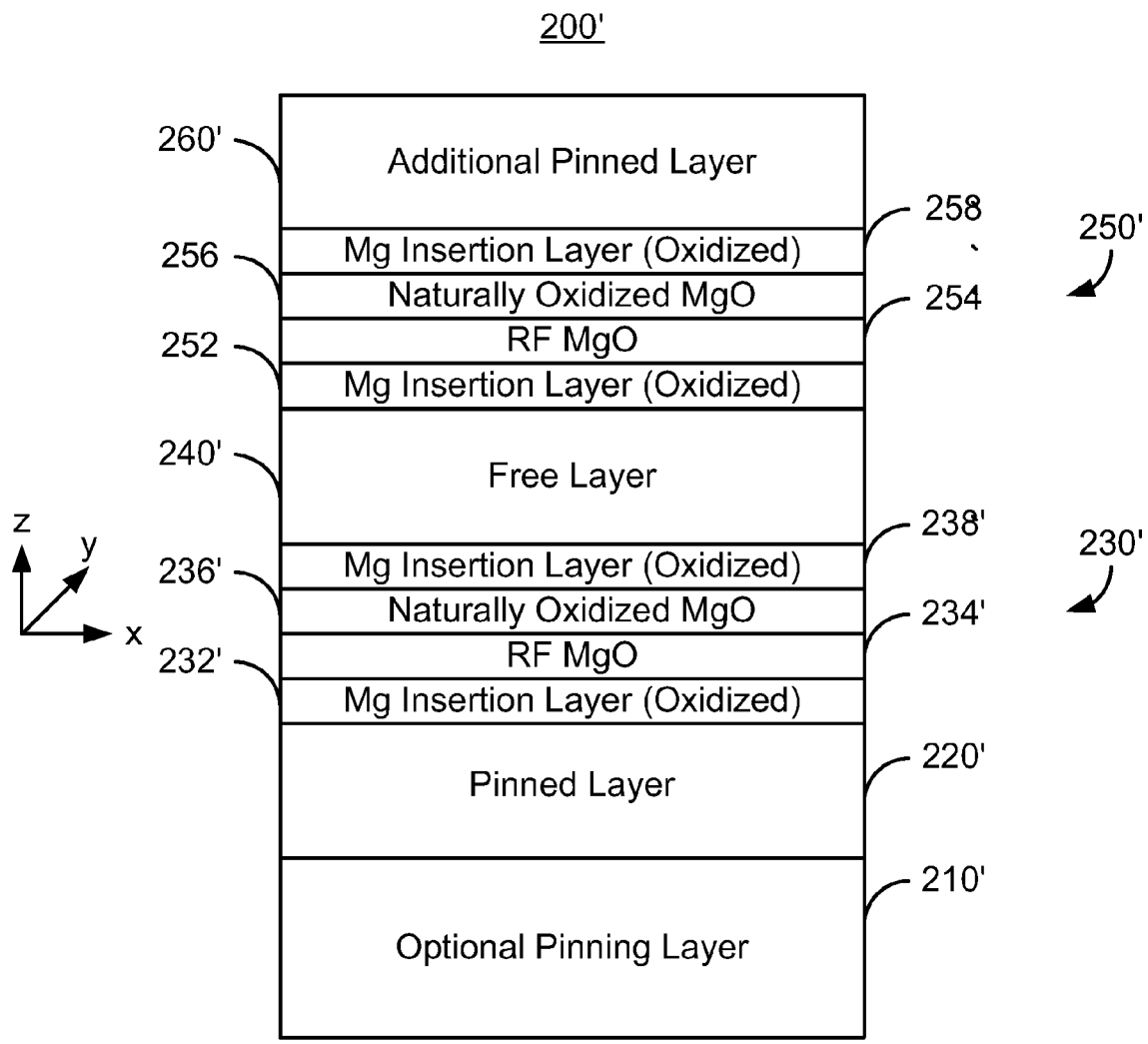
FIG. 10 is another exemplary embodiment of a barrier layer in a magnetic tunneling junction.

FIG. 10 depicts an exemplary embodiment of a magnetic junction 200' usable in a magnetic memory or in other applications. For example, the magnetic junction 200' may be used in a magnetic memory such as an STT-RAM. For clarity, FIG. 10 is not to scale. The magnetic junction 200 is analogous to the magnetic junctions 100, 100', 100'', 100''', 100'''', 100''''' and 200. Consequently, analogous components are labeled similarly. The magnetic junction 200' thus includes an optional pinning layer 210', a pinned layer 220', a tunneling barrier layer 230', a free layer 240', a spacer layer 250', an additional pinned layer 260', and an additional optional pinning layer 260' that are analogous to the optional pinning layer 110/110'/110''/110'''/110''''/110'''''/210, the pinned layer 120/120'/120''/120'''/120''''/120'''''/220, the tunneling barrier layer 130/130'/130''/130'''/130''''/130'''''/230, the free layer 140/140'/140''/140'''/140''''/140'''''/240, the spacer layer 250, the pinning layer 260, and the optional pinning layer 270. Although layers 210', 220', 230', 240', 250', 260', and 270' are shown with a particular orientation, this orientation may vary in other embodiments. In addition, although depicted as simple layers, the pinned layer 220', the free layer 240', and/or the pinned layer 260' may include multiple layers. In addition, the pinning layer 210' and/or the pinning layer 270' may be omitted or may include multiple layers.

The tunneling barrier 230' includes multiple layers. An insertion layer 232', an RF oxide layer 234', a natural oxide layer 236', and an insertion layer 238' are analogous to the layers 132, 134, 136, and 138, respectively. Further, some of the layers 232' and/or 238' might be omitted. Although deposited as metal layers, some or all of the layers 232' and 238' may be oxidized during processing of the magnetic junction 200.

The additional spacer layer 250' is a tunneling barrier layer including insertion layer 252, RF oxide layer 254, naturally oxidized layer 256, and insertion layer 258 that are analogous to layers 232', 234', 236', and 238', respectively. In some embodiments, the arrangement of the layers 252, 254, 256, and 258 may be altered. Further, the layers 252 and/or 258 might be omitted. In some embodiments, Mg is used in the layers 252, 254, 256, and 258. In other embodiments, other and/or additional metals might be used in one or more of the layers 252, 254, 256, and 258.

Figure 11:
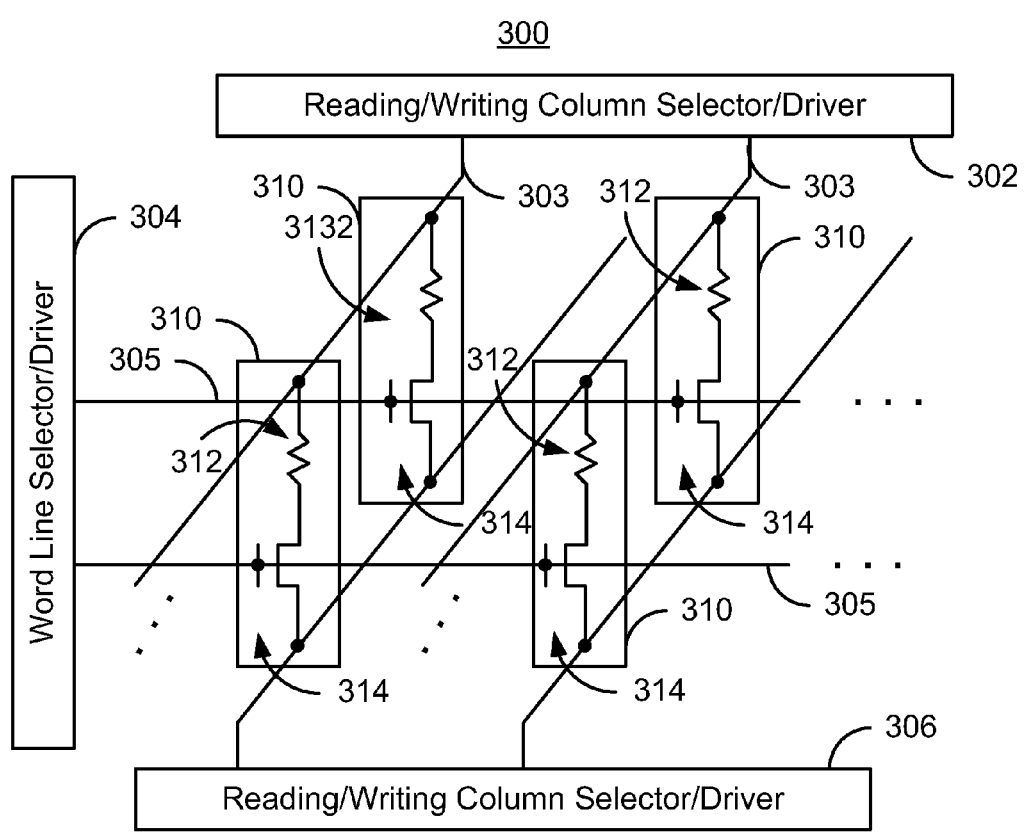
FIG. 11 is an exemplary embodiment of a magnetic memory including magnetic junctions having engineered barrier layers.

The magnetic junction 200' may share at least some of the benefits of the magnetic junctions 100, 100', 100'', 100''', 100'''', 100''''' and/or 200. For example, use of the RF MgO layer 234' in combination with the naturally oxidized MgO layer 236' may allow the RA of the tunneling barrier 230' to be tuned. Similarly, use of the RF MgO layer 254 in combination with the naturally oxidized MgO layer 256 may allow the RA of the tunneling barrier 250' to be tuned as described above. Thus the RA of the magnetic junction 200' may be tuned. Further, the RAs achieved may be more reproducible and reliable. In addition, the magnetic junction 200' may have a higher tunneling magnetoresistance ratio than for either a barrier layer formed only by RF deposition or only be naturally oxidizing an Mg metal layer. In some embodiments, the spin torque efficiency may also be improved. Further, in some embodiments, the perpendicular anisotropy level for the free layer 240' adjacent to the tunneling barrier layers 230' and 250' may be enhanced. Thus, the performance and manufacturability of the magnetic junction 200' may be improved. Further, the magnetic junctions 100, 100', 100'', 100''', 100'''', 100''''', 200 and/or 200''' may be used in a magnetic memory. FIG. 11 depicts an exemplary embodiment of one such memory 300. The magnetic memory 300 includes reading/writing column select drivers 302 and 306 as well as word line select driver 304. Note that other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junctions 312 may be one of the magnetic junctions 100, 100', 100", 100''', 100'''', 100''''', 200 and/or 200'''. Although one magnetic junction 312 is shown per cell 310, in other embodiments, another number of magnetic junctions 312 may be provided per cell. As such, the magnetic memory 300 may enjoy the benefits described above, such as enhanced performance rate and manufacturability.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A method for fabricating a magnetic junction usable in a magnetic memory comprising:
   providing a pinned layer including at least one ferromagnetic layer;
   providing an engineered nonmagnetic tunneling barrier layer, the engineered nonmagnetic tunneling barrier layer having a tuned resistance area product, the step of providing the engineered nonmagnetic tunneling barrier layer further including
      depositing a first metal insertion layer wherein the first metal insertion layer is a non-magnetic metal insertion layer;
      radio-frequency depositing a first oxide layer on the first metal insertion layer;
      depositing a metal layer; and
      oxidizing the metal layer to provide a second oxide layer, the first oxide layer and the second oxide layer being on the first metal insertion layer, the method being free of an oxidation step between the step of depositing the first metal insertion layer and at least one of depositing the metal layer and radio-frequency depositing the first oxide layer; and
   providing a free layer including at least an additional ferromagnetic layer, the nonmagnetic tunneling barrier layer residing between the pinned layer and the free layer, the free layer configured to be switchable between a plurality of stable magnetic states when a write current is passed through the magnetic junction.

2. The method of claim 1 wherein the step of providing the engineered nonmagnetic tunneling barrier layer further includes:
   depositing a second metal insertion layer, the first oxide layer and the second oxide layer residing between the first metal insertion layer and the second metal insertion layer.

3. The method of claim 2 wherein the first oxide layer adjoins the first insertion layer.

4. The method of claim 2 wherein the second oxide layer adjoins the first insertion layer.

5. The method of claim 2 wherein the step of providing the engineered nonmagnetic tunneling barrier layer further includes oxidizing the second metal insertion layer.

6. The method of claim 2 further comprising:
   providing a nonmagnetic layer, the free layer residing between the nonmagnetic layer and the engineered tunneling barrier layer; and
   providing an additional pinned layer, the nonmagnetic layer residing between the additional pinned layer and the free layer.

7. The method of claim 6 wherein the nonmagnetic layer is an additional engineered nonmagnetic tunneling barrier layer having an additional tuned resistance area product.

8. The method of claim 2 further comprising:
   providing a plurality of contacts including a first contact and a second contact for the magnetic junction.

9. The method of claim 2 wherein the pinned layer is a synthetic antiferromagnet (SAF) including a plurality of ferromagnetic layers separated by a nonmagnetic separation layer, the plurality of ferromagnetic layers being antiferromagnetically aligned.

10. The method of claim 2 wherein the free layer is a synthetic antiferromagnet (SAF) including a plurality of ferromagnetic layers separated by a nonmagnetic separation layer, the plurality of ferromagnetic layers being antiferromagnetically aligned.

11. A method for magnetic memory comprising:
   providing a plurality of magnetic memory cells, each of the plurality of magnetic memory cells including at least one magnetic memory element and at least one selection device, the step of providing the at least one magnetic memory element further including
      providing a pinned layer for each of the at least one magnetic memory element, the pinned including at least one ferromagnetic layer;
      providing an engineered nonmagnetic tunneling barrier layer for each of the at least one magnetic memory element, the engineered nonmagnetic tunneling barrier layer having a tuned resistance area product, the step of providing the engineered nonmagnetic tunneling barrier layer further including
         depositing a first metal insertion layer wherein the first metal insertion layer is a non-magnetic metal insertion layer;
         radio-frequency depositing a first oxide layer;
         depositing a metal layer; and
         oxidizing the metal layer to provide a second oxide layer, the first oxide layer and the second oxide layer being on the first metal insertion layer, the method being free of an oxidation step between the step of depositing the first metal insertion layer and at least one of depositing the metal layer and radio-frequency depositing the first oxide layer; and
      providing a free layer for each of the at least one magnetic memory element, the free layer including at least an additional ferromagnetic layer, the nonmagnetic tunneling barrier layer residing between the pinned layer and the free layer, the free layer configured to be switchable between a plurality of stable magnetic states when a write current is passed through the magnetic memory element of the plurality of magnetic memory elements;
   providing at least one bit line coupled with the plurality of magnetic memory cells; and
   providing at least one word line coupled with the plurality of magnetic memory cells.

12. The method of claim 11 wherein the step of providing the engineered nonmagnetic tunneling barrier layer further includes:

depositing a second metal insertion layer, the first oxide layer and the second oxide layer residing between the first metal insertion layer and the second metal insertion layer.

13. The method of claim 12 wherein the first oxide layer adjoins the first insertion layer.

14. The method of claim 12 wherein the second oxide layer adjoins the first insertion layer.

15. The method of claim 12 wherein the step of providing the engineered nonmagnetic tunneling barrier layer further includes oxidizing at least one of the first metal insertion layer and the second metal insertion layer.

16. The method of claim 12 wherein the step of providing the at least one magnetic memory element further includes:
providing a nonmagnetic layer, the free layer residing between the nonmagnetic layer and the engineered tunneling barrier layer; and
providing an additional pinned layer, the nonmagnetic layer residing between the additional pinned layer and the free layer.

17. The method of claim 16 wherein the nonmagnetic layer is an additional engineered nonmagnetic tunneling barrier layer having an additional tuned resistance area product.

18. The method of claim 12 further comprising:
providing a plurality of contacts, each of the plurality of magnetic memory elements having a first contact and a second contact of the plurality of contacts.

19. The method of claim 12 wherein the pinned layer is a synthetic antiferromagnet (SAF) including a plurality of ferromagnetic layers separated by a nonmagnetic separation layer, the plurality of ferromagnetic layers being antiferromagnetically aligned.

20. The method of claim 12 wherein the free layer is a synthetic antiferromagnet (SAF) including a plurality of ferromagnetic layers separated by a nonmagnetic separation layer, the plurality of ferromagnetic layers being antiferromagnetically aligned.

* * * * *

UNITED STATES PATENT AND TRADEMARK OFFICE
CERTIFICATE OF CORRECTION

PATENT NO. : 8,987,006 B2
APPLICATION NO. : 13/451679
DATED : March 24, 2015
INVENTOR(S) : Moon et al.

It is certified that error appears in the above-identified patent and that said Letters Patent is hereby corrected as shown below:

In the specification

Column 1, line 10 please insert the following paragraph:

--GOVERNMENT RIGHTS
This invention was made with U.S. Government support under Grant/Contract No. HR0011-09-C-0023 awarded by DARPA. The U.S. Government retains certain rights in this invention. Distribution authorized to U.S. Government Agencies only.--

Signed and Sealed this
Twenty-third Day of February, 2016

Michelle K. Lee
*Director of the United States Patent and Trademark Office*